United States Patent
Bakarian et al.

(10) Patent No.: US 6,795,953 B2
(45) Date of Patent: Sep. 21, 2004

(54) METHOD FOR AVOIDING FALSE FAILURES ATTRIBUTABLE TO DUMMY INTERCONNECTS DURING DEFECT ANALYSIS OF AN INTEGRATED CIRCUIT DESIGN

(75) Inventors: Sergei Bakarian, Sunnyvale, CA (US); Julie Segal, Palo Alto, CA (US)

(73) Assignee: HPL Technologies, Inc., San Jose, CA (US)

( * ) Notice: Subject to any disclaimer, the term of this patent is extended or adjusted under 35 U.S.C. 154(b) by 94 days.

(21) Appl. No.: 10/167,039

(22) Filed: Jun. 11, 2002

(65) Prior Publication Data

US 2003/0229867 A1 Dec. 11, 2003

(51) Int. Cl.[7] .................. G06F 17/50; G06F 9/45; G01R 31/305
(52) U.S. Cl. .................. 716/5; 716/1; 716/4; 324/751
(58) Field of Search .................. 716/1, 4, 5, 11; 324/751

(56) References Cited

U.S. PATENT DOCUMENTS

| 5,901,063 | A | * | 5/1999 | Chang et al. | ........... 716/4 |
| 6,128,768 | A | * | 10/2000 | Ho | ........... 716/5 |
| 6,438,729 | B1 | * | 8/2002 | Ho | ........... 716/1 |
| 6,633,174 | B1 | * | 10/2003 | Satya et al. | ........... 324/751 |
| 2002/0187582 | A1 | * | 12/2002 | Satya et al. | ........... 438/48 |
| 2003/0140328 | A1 | * | 7/2003 | Cobb et al. | ........... 716/19 |

OTHER PUBLICATIONS

W. Grobman et al., Reticle Enhancement Technology: Implications and Challenges for Physical Design, DAC, 6 pages, Jun. 2001.
D. Woodie, "Chemical Mechanical Polishing Primer", [Internet], http://www.nnf.cornell.edu/equipment/CMPPrimer.html, 14 pages printed May 18, 2002 (no date).
L–Edit Quick Reference ENGS85, [Internet]http://www.engineering.dartmouth.edu/~microeng./ledit/ledit.hints.html, 2 pages, Apr. 21, 2001, printed Mar. 22, 2002.
C. G. Levey, "Low Resolution Mask Making Procedures ([SIC] ", [Internet]http://thayer.dartmout.edu/~microeng/ledit/leditlmask.html, 2 pages, printed Jun. 19, 2003.

* cited by examiner

Primary Examiner—A. M. Thompson
(74) Attorney, Agent, or Firm—Sierra Patent Group, Ltd.

(57) ABSTRACT

A method for avoiding false failures attributable to dummy interconnects during defect analysis of an integrated circuit design is described. Described processing includes retrieving conductivity layers information for an integrated circuit design from a GDSII formatted file; defining a dummy polygons layer and a target layer; restoring interconnect polygons from the conductivity layers information into the dummy polygons layer; copying the interconnect polygons from the dummy polygons layer to the target layer, except for dummy interconnect polygons; and performing defect analysis of the integrated circuit design using the target layer.

7 Claims, 4 Drawing Sheets

METHOD FOR AVOIDING FALSE FAILURES ATTRIBUTABLE TO DUMMY INTERCONNECTS DURING DEFECT ANALYSIS OF AN INTEGRATED CIRCUIT DESIGN

FIELD OF THE INVENTION

The present invention generally relates to defect analysis on integrated circuit designs and in particular, to a method for avoiding false failures attributable to dummy interconnects during defect analysis of an integrated circuit design.

BACKGROUND OF THE INVENTION

Chemical mechanical polishing (CMP) is a widely adopted technique for global planarization during the fabrication of integrated circuits. Control of post-CMP topography variation is crucial, however, in meeting challenges like the ever decreasing depth-of-focus in photolithography and the ever increasing levels of interconnect due to routing complexity. Therefore, dummy interconnects are usefully placed in an integrated circuit design for leveling the integrated circuit topography for the CMP process.

Defect analysis, such as circuit area analysis, predicts failures of an integrated circuit that result from probabilistic defects. One problem with conventional defect analysis techniques is their general inability to avoid false failures attributable to dummy interconnects during defect analysis of an integrated circuit design. In particular, such defect analysis is generally unable to distinguish the difference between a true failure resulting from a simulated defect impinging upon a current carrying interconnect and a false failure resulting from a simulated defect impinging upon a dummy interconnect. The second case is referred to as being a "false failure", because such occurrence has no significant effect on the functionality or performance of the integrated circuit design. This deficiency may thus result in overly conservative design and unnecessary testing for false failures, both of which add unwarranted cost to the manufacture of the integrated circuit.

OBJECTS AND SUMMARY OF THE INVENTION

Accordingly, an object of the present invention is a method for avoiding false failures attributable to dummy interconnects during defect analysis of an integrated circuit design.

This and additional objects are accomplished by the various aspects of the present invention, wherein briefly stated, one aspect is a method for avoiding false failures attributable to dummy interconnects during defect analysis of an integrated circuit design, comprising: providing a target layer generated by including electrical current carrying interconnects of an integrated circuit design, but not including dummy interconnects of the integrated circuit design; and performing defect analysis of the integrated circuit design using the target layer.

Another aspect is a method for avoiding false failures attributable to dummy interconnects during defect analysis of an integrated circuit design, comprising: storing interconnect polygon information for an integrated circuit design into a dummy polygons layer; copying the interconnect polygon information from the dummy polygons layer to a target layer, except for dummy interconnect polygon information; and performing defect analysis of the integrated circuit design using the target layer instead of the dummy polygons layer.

Still another aspect is a method for avoiding false failures attributable to dummy interconnects during defect analysis of an integrated circuit design, comprising: retrieving conductivity layers information for an integrated circuit design from a GDSII formatted file; defining a dummy polygons layer and a target layer; restoring interconnect polygons from the conductivity layers information into the dummy polygons layer; copying the interconnect polygons from the dummy polygons layer to the target layer, except for dummy interconnect polygons; and performing defect analysis of the integrated circuit design using the target layer.

Additional objects, features and advantages of the various aspects of the invention will become apparent from the following description of its preferred embodiments, which description should be taken in conjunction with the accompanying drawings.

DETAILED DESCRIPTION OF THE PREFERRED EMBODIMENT

Figure 1:
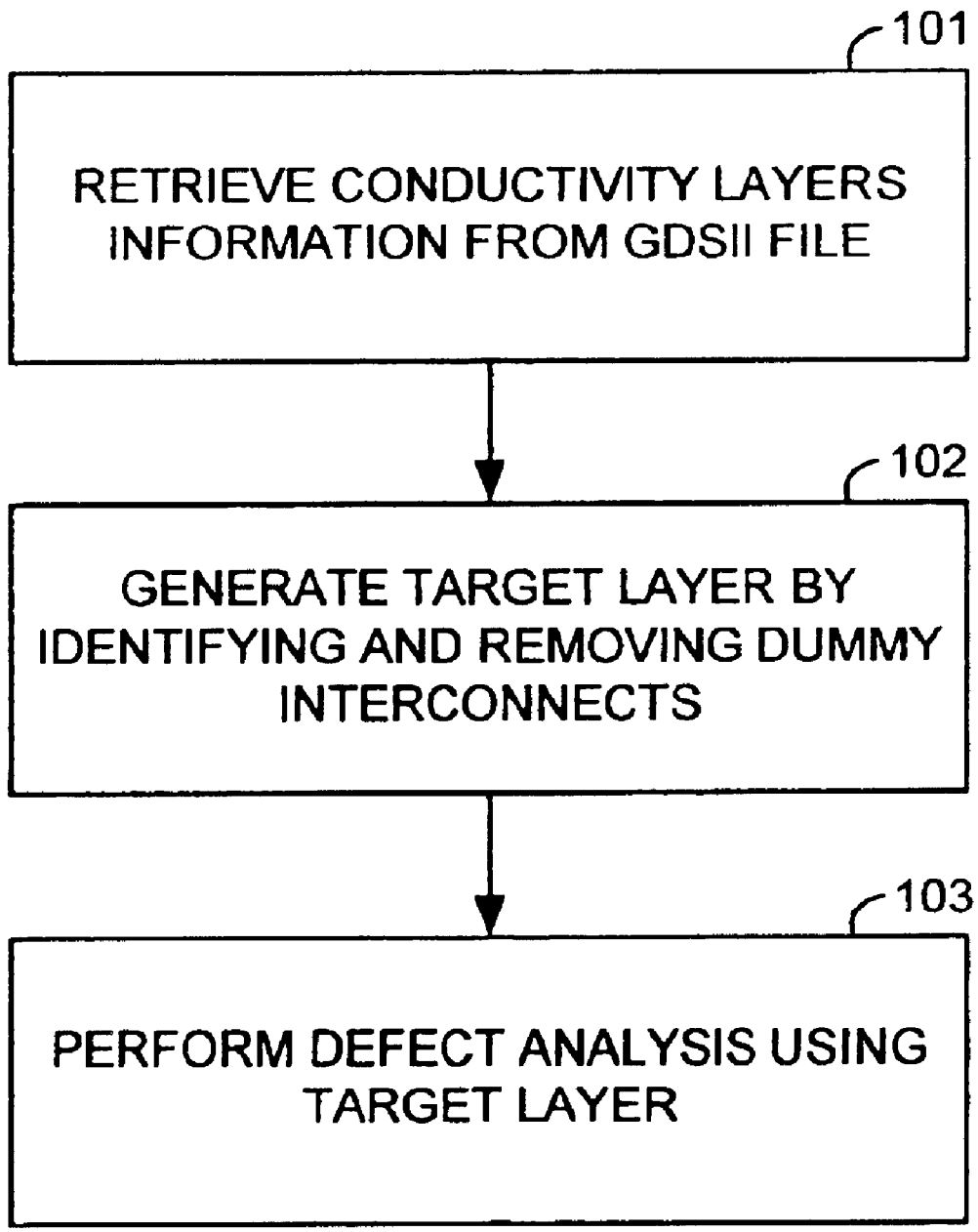
FIG. 1 illustrates, as an example, a flow diagram of a method for avoiding false failures attributable to dummy interconnects during defect analysis of an integrated circuit design, utilizing aspects of the present invention.

FIG. 1 illustrates a flow diagram of a method for avoiding false failures attributable to dummy interconnects during defect analysis of an integrated circuit design. A computer programmed to perform the method along with a memory for storing certain information is its preferred implementation.

In 101, conductivity layers information is retrieved for the integrated circuit design, such as from a GDSII formatted file that includes such and other design information for mask generation. The conductivity layers information includes object or polygon information for interconnects or nets of the integrated circuit that carry electrical current, such as in the form of signals, references or power, through the integrated circuit, as well as dummy interconnects that do not. In 102, a target layer is generated by including information of the current carrying interconnects of the integrated circuit, but not the dummy interconnects. In 103, defect analysis is then performed using the target layer in lieu of the original conductivity layers information, so that effectively, an integrated circuit design without dummy interconnects is analyzed. In this way, false failures attributable to such dummy interconnects are avoided.

Figure 2:
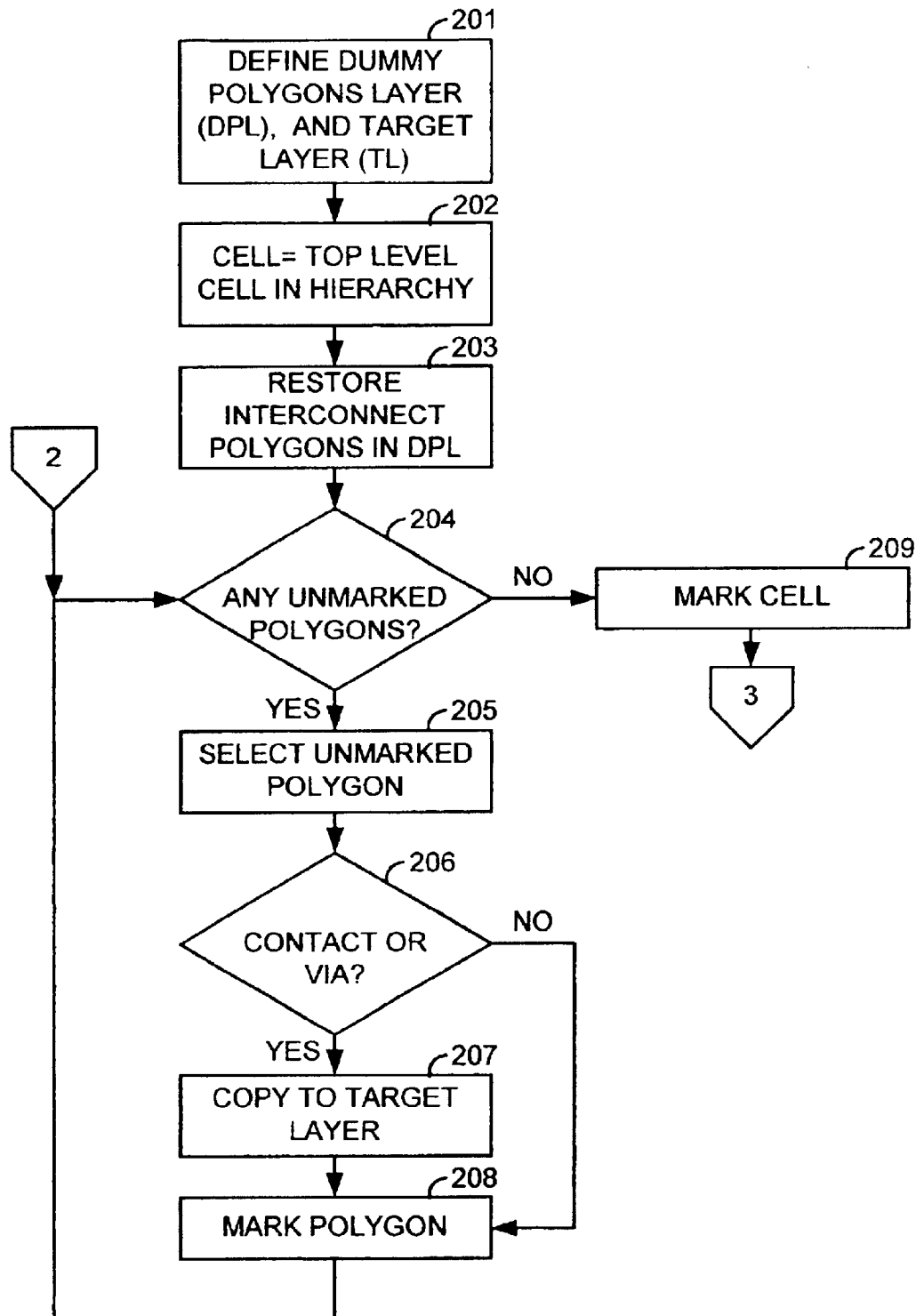
FIGS. 2~3 illustrate, as an example, a flow diagram of a method for generating a target layer, utilizing aspects of the present invention.
Figure 3:
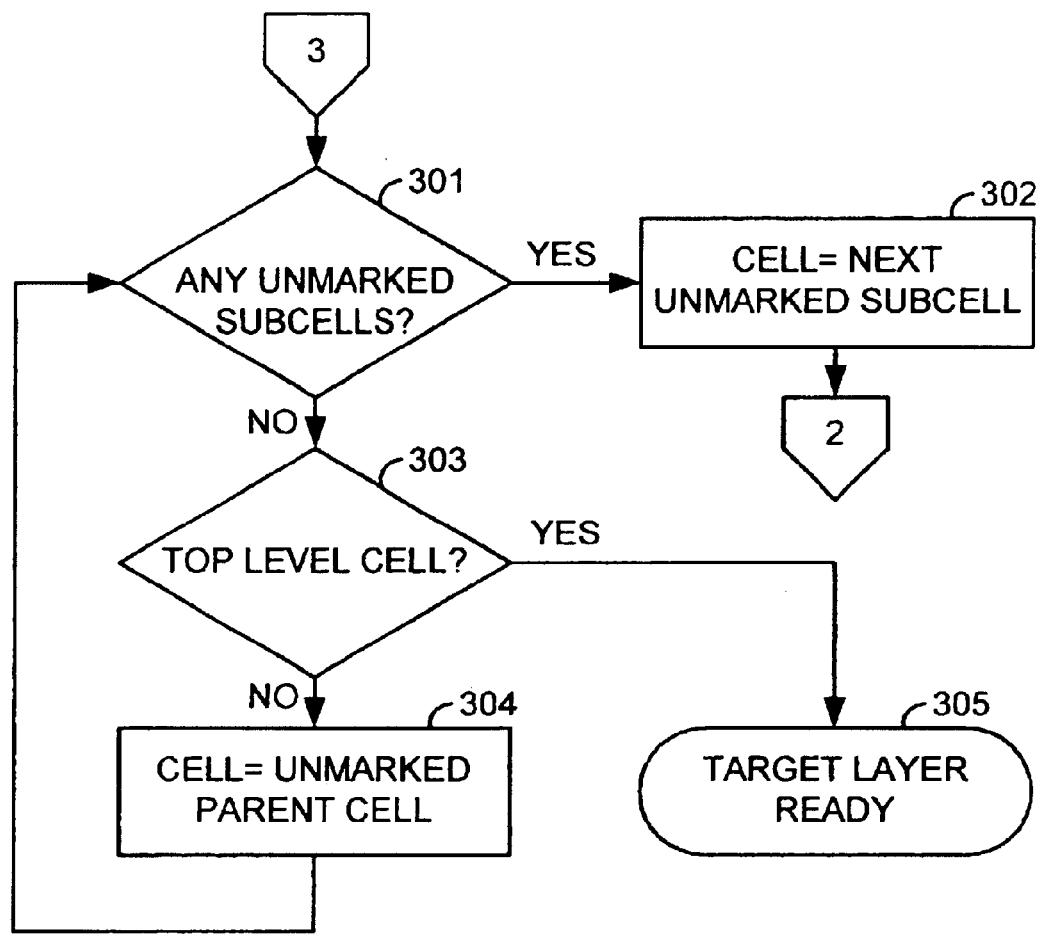

FIGS. 2 and 3 illustrate a flow diagram of a method for generating the target layer. In 201, two layers are defined for processing purposes. The first is a dummy polygon layer (DPL) that includes the retrieved conductivity layer information, and the second is a target layer (TL) that includes the retrieved conductivity layer information with the dummy interconnects removed. As previously described, the target layer (TL) will then be used for defect analysis, so that false failures resulting from simulated defects interacting with dummy interconnects can be avoided. Although the singular term "layer" is used herein, it is to be appreciated that in practice, multiple mask layers are generally involved in the described processing, so that the singular term "layer" is also to be understood to mean the plural term "layers" as appropriate in such cases.

In 202, a cell is selected for processing. Preferably, it is the top-level cell of the cell hierarchy defining the integrated circuit design. In 203, all interconnect polygon information for the integrated circuit design is then restored into the DPL. This includes information for both "visible" interconnect polygons that are at least partially viewable between subcells, and "submerged" interconnect polygons that are completely hidden within or behind the subcells.

Figure 4:
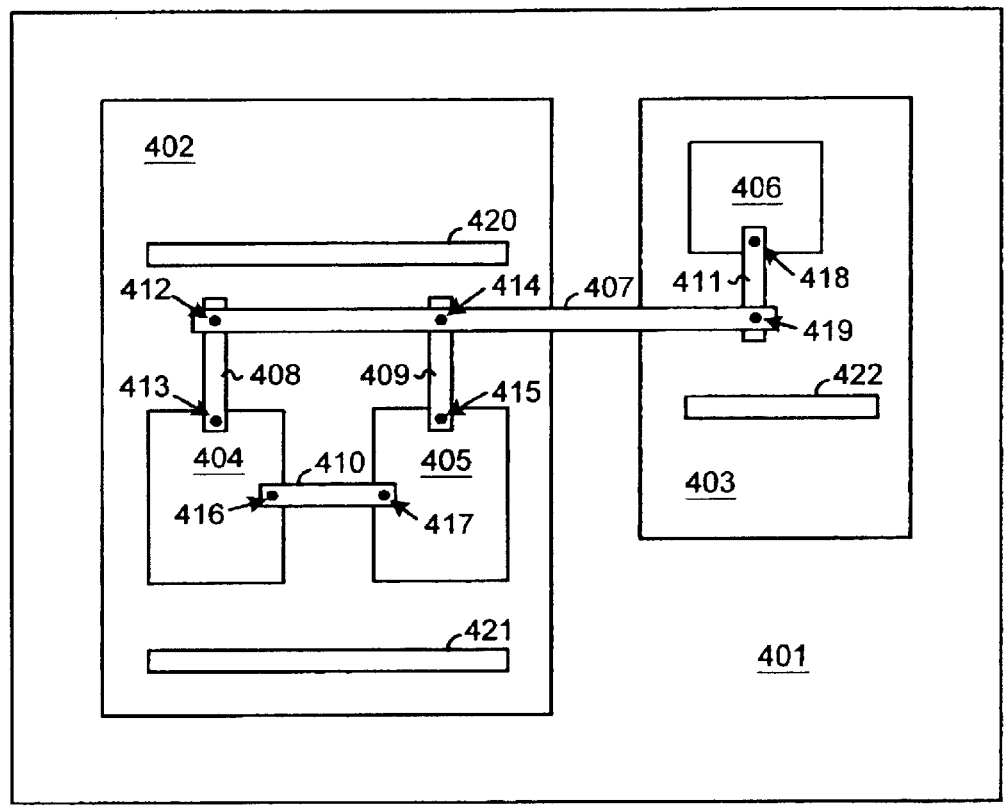
FIG. 4 illustrates, as a simplified example, a top plan view of an integrated circuit design depicting its cell hierarchy including interconnects.

For example, in FIG. 4, at the level of the top-level cell 401, only current carrying interconnect 407 is "visible". At this level, current carrying interconnects 408, 409 and 410 along with dummy interconnects 420 and 421 are "submerged" within subcell 402, and current carrying interconnect 411 along with dummy interconnect 422 are "submerged" within subcell 403. At the level of the subcell 402, on the other hand, current carrying interconnects 408, 409 and 410 along with dummy interconnects 420 and 421 are all "visible". Likewise, at the level of the subcell 403, current carrying interconnect 411 along with dummy interconnect 422 are both "visible".

In 204, the current cell is checked to determine whether it has any unmarked visible interconnect polygons. An unmarked interconnect polygon in this case, indicates that the polygon has not yet been processed through 204~208. If the determination in 204 results in a YES, then in 205, an unmarked visible interconnect polygon in the current cell is selected, and a determination is made, in 206, whether the selected interconnect polygon has an associated contact or via electrically coupled to it.

If the determination in 206 is a YES, then the interconnect polygon is determined to be part at least part of a current carrying net in the integrated circuit design, and in 207, its information is copied to the TL. On the other hand, if the determination in 206 is a NO, then the interconnect polygon is determined to be a dummy interconnect, and its information is not copied to the TL. In either event, in 208, the interconnect polygon is then marked to indicate completion of its processing, and the method then jumps back to 204 to process a next unmarked visible interconnect polygon in the current cell.

For example, in FIG. 4, interconnect polygons 407, 408, 409 and 411 form one current carrying net, while interconnect polygon 410 forms another. In this case, vias 412 and 413 are electrically coupled to interconnect polygon 408; vias 414 and 415 are electrically coupled to interconnect polygon 409; vias 418 and 419 are electrically coupled to interconnect polygon 411; and vias 412, 413, 414, 415, 418 and 419 are electrically coupled to interconnect polygon 407. Likewise, vias 416 and 417 are electrically coupled to interconnect polygon 410. Dummy interconnects 420, 421 and 422, on the other hand, have no vias or contacts electrically coupled to them, since they serve no electrical function in the integrated circuit design, only a mechanical structural function.

After all visible interconnect polygons in the current cell have been processed through 204~208, so that there are no more unmarked interconnect polygons that are visible at the current level, the determination in 204 becomes a NO. In such case, in 209, the current cell is then marked to indicate completion of its processing. Off-page connector 1 then indicates continued processing from 209 in FIG. 2 to 301 in FIG. 3.

In 301, a determination is made whether any submerged interconnect polygons visible in a selected subcell of the current cell are unmarked. If there are such unmarked interconnect polygons, then in 302, the current cell is redefined to be the selected subcell. Off-page connector 2 then indicates continued processing from 302 in FIG. 3 back to 204 in FIG. 2 so that all unmarked visible interconnect polygons in the subcell can be processed through 204~208.

After all visible interconnect polygons in the subcell have been processed through 204~208, the determination in 204 again becomes a NO, and in 209, the subcell is marked to indicate completion of its processing. Off-page connector 1 then indicates continued processing from 209 in FIG. 2 to 301 in FIG. 3.

In 301, a determination is made whether any submerged interconnect polygons visible in a selected second-level subcell of the current cell (i.e., the previously selected subcell) are unmarked. If there is any such unmarked interconnect polygons, then in 302, the current cell is again redefined to be the selected second-level subcell. Off-page connector 2 then indicates continued processing from 302 in FIG. 3 back to 204 in FIG. 2 so that all unmarked visible interconnect polygons in the second-level subcell can be processed through 204~208.

The method thereupon continues until a bottom-level subcell related to the previously selected subcells is processed. At that time, the determination in 301 then results in its first NO. In 303, a determination is then made whether the current cell is the top-level cell. If the determination results in a NO, then in 304, the current cell is redefined to be an unmarked parent cell of the current cell (i.e., an unmarked cell at the immediately higher-level in the cell hierarchy than the current cell), and 301~304 and 204~209 are repeatedly repeated, working up and down the cell hierarchy until all levels of subcells have been processed and consequently, the current cell once again is defined to be the top-level cell. At that time, the determination in 303 then results in its first YES, and in 305, an indication is generated indicating that the target layer is now completed or ready.

Although the various aspects of the present invention have been described with respect to a preferred embodiment, it will be understood that the invention is entitled to full protection within the full scope of the appended claims.

We claim:

1. A method for reducing false failures attributable to dummy interconnects in an integrated circuit design during defect analysis of said integrated circuit design, said method comprising:

receiving conductivity layers information for said integrated circuit design, wherein said conductivity information includes polygon information for conducting polygons and dummy polygons wherein said dummy polygons are non-conducting polygons;

generating a dummy polygon layer including all polygons from said conductivity information;

generating a target layer from said dummy polygon layer wherein said target layer includes only conducting polygons; and performing said defect analysis on said target layer.

2. The method of claim 1 wherein said conducting polygons include signal passing interconnects.

3. The method of claim 1 wherein said conducting polygons include reference voltage providing interconnects.

4. The method of claim 1 wherein said step of generating said target layer comprises:

reading a polygon from said dummy polygon layer;

determining whether said polygon is a conducting polygon; and inserting said polygon into said target layer responsive to a determination that said polygon is a conducting polygon.

5. The method of claim 4 wherein said step of determining whether said polygon is a conducting polygon comprises:

determining whether said polygon is associated with a contact.

6. The method of claim 4 wherein said step of determining whether said polygon is a conductive polygon comprises:

determining whether said polygon is associated with a via.

7. The method of claim 1 wherein said defect analysis is circuit area analysis.

* * * * *